(12) United States Patent
Isakharov

(10) Patent No.: US 12,270,831 B2
(45) Date of Patent: Apr. 8, 2025

(54) APPARATUS AND METHOD FOR PROTECTING PROBE CARD AND PROBES USING THERMAL HEAT SENSOR TRACE

(71) Applicant: Intel Corporation, Santa Clara, CA (US)

(72) Inventor: Arthur Isakharov, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 526 days.

(21) Appl. No.: 17/737,042

(22) Filed: May 5, 2022

(65) Prior Publication Data

US 2023/0358787 A1   Nov. 9, 2023

(51) Int. Cl.
  *G01R 1/073* (2006.01)
  *G01K 7/24* (2006.01)
(52) U.S. Cl.
  CPC ........... *G01R 1/07378* (2013.01); *G01K 7/24* (2013.01)
(58) Field of Classification Search
  CPC ............................. G01R 1/07378; G01K 7/24
  See application file for complete search history.

(56) References Cited

U.S. PATENT DOCUMENTS

| | | | | |
|---|---|---|---|---|
| 2017/0363680 A1* | 12/2017 | Saito | .................. | G01R 31/2875 |
| 2021/0190826 A1* | 6/2021 | Brecht | ............... | G01R 1/07314 |
| 2022/0128624 A1* | 4/2022 | Kasai | ..................... | G01K 13/00 |
| 2023/0078708 A1* | 3/2023 | Chaji | .................. | H01L 25/0753 |
| | | | | 257/776 |

* cited by examiner

*Primary Examiner* — Neel D Shah
*Assistant Examiner* — Adam S Clarke
(74) *Attorney, Agent, or Firm* — Viering, Jentschura & Partner mbB

(57) ABSTRACT

An apparatus includes a thermal heat sensor trace including conductive metal and disposed in a space transformer, the thermal heat sensor trace being configured to form a resistance, and a controller configured to sense a voltage across the resistance formed by the thermal heat sensor trace, the voltage positively correlating to a temperature of the space transformer. The controller is further configured to determine whether the sensed voltage is greater than or equal to a predetermined threshold voltage, and based on the sensed voltage being determined to be greater than or equal to the predetermined threshold voltage, output an alert signal for reducing and/or warning of the temperature of the space transformer.

20 Claims, 5 Drawing Sheets

APPARATUS AND METHOD FOR PROTECTING PROBE CARD AND PROBES USING THERMAL HEAT SENSOR TRACE

BACKGROUND

A probe card is an interface between automatic test equipment (ATE) and a semiconductor die. The ATE runs sort test content via the probe card to the die, to screen for functional and structural defects of the die. To protect the probe card and probes connected thereto, local current clamps of power islands, which reside on a main power rail, may be set to much higher values than the power islands can tolerate.

To solve the above problem, a protection circuit (e.g., an electronic fuse) may be installed to detect and trip the main power rail when a load current to a power island exceeds a specified current load (either dynamic or direct current), preventing corresponding probes from overheating, melting, recessing and burning. However, this protection circuit may be limited to the few corresponding probes and may not protect a large probe array, due to only the corresponding probes connected to the power island being monitored. This may lead to uneven current distribution to all probes, which may lead to damage of the probe card.

BRIEF DESCRIPTION OF THE DRAWINGS

In the drawings, like reference characters generally refer to the same parts throughout the different views. The drawings are not necessarily to scale, emphasis instead generally being placed upon illustrating the present disclosure. The dimensions of the various features or elements may be arbitrarily principles expanded or reduced for clarity. In the following description, various aspects of the present disclosure are described with reference to the following drawings, in which.

DETAILED DESCRIPTION

Figure 1A:
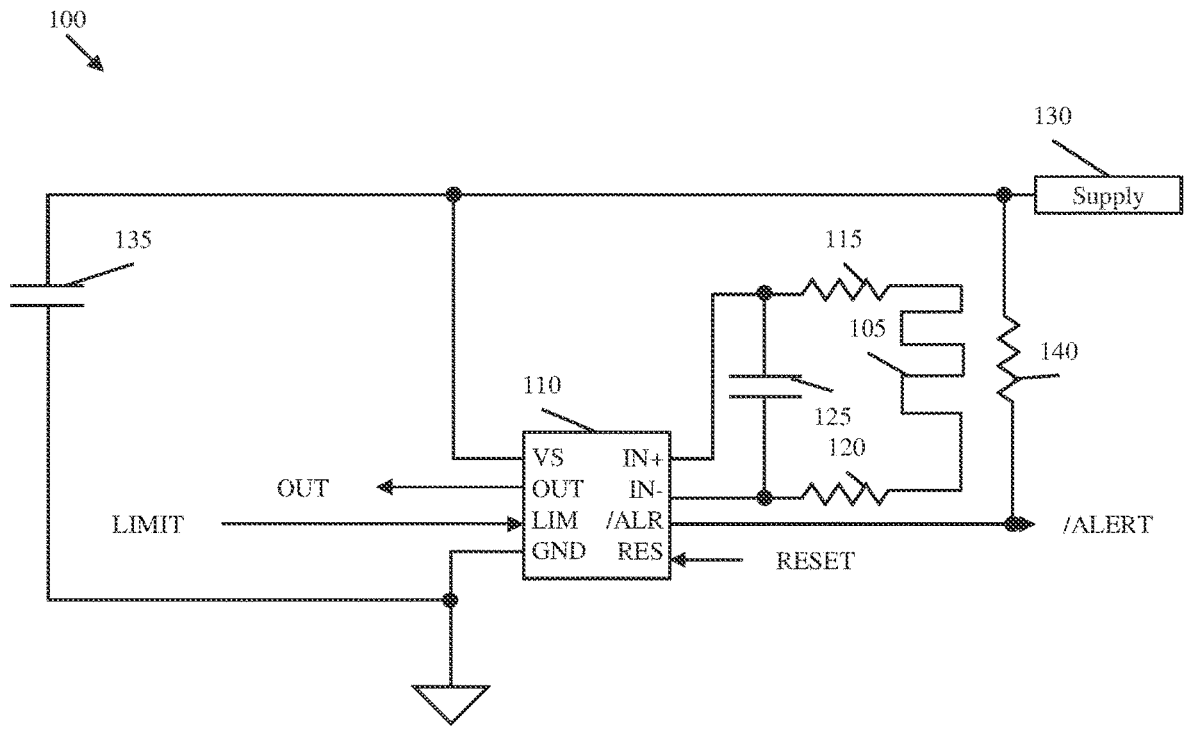
FIGS. 1A and 1B are circuit block diagrams of an apparatus for protecting a probe card and probes, using a thermal heat sensor trace, according to aspects of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure relates to apparatuses and methods for protecting a probe card and probes, using a thermal heat sensor trace.

A present apparatus may include a thermal heat sensor trace including conductive metal and disposed in a space transformer, the thermal heat sensor trace being configured to form a resistance, and a controller configured to sense a voltage across the resistance formed by the thermal heat sensor trace, the voltage positively correlating to a temperature of the space transformer. The controller may be further configured to determine whether the sensed voltage is greater than or equal to a predetermined threshold voltage, and based on the sensed voltage being determined to be greater than or equal to the predetermined threshold voltage, output an alert signal for reducing and/or warning of the temperature of the space transformer.

In another aspect, a method pursuant to the present disclosure may include forming a resistance, by a thermal heat sensor trace including conductive metal and disposed in a space transformer, and sensing, by a controller, a voltage across the resistance formed by the thermal heat sensor trace, the voltage positively correlating to a temperature of the space transformer. The method may further include determining, by the controller, whether the sensed voltage is greater than or equal to a predetermined threshold voltage, and based on the sensed voltage being determined to be greater than or equal to the predetermined threshold voltage, outputting, by the controller, an alert signal for reducing and/or warning of the temperature of the space transformer.

In yet another aspect, a present apparatus may include forming means for forming a resistance, the forming means including conductive metal and disposed in a space transformer, and sensing means for sensing a voltage across the resistance formed by the forming means, the voltage positively correlating to a temperature of the space transformer. The apparatus may further include determining means for determining whether the sensed voltage is greater than or equal to a predetermined threshold voltage, and outputting means for, based on the sensed voltage being determined to be greater than or equal to the predetermined threshold voltage, outputting an alert signal for reducing and/or warning of the temperature of the space transformer.

The above aspects may include using a physical property (resistance) of a thermal heat sensor trace to determine a temperature around the trace, and using this temperature to detect extreme power dissipation in a probe card (e.g., a space transformer) around an area of a probe array due to current overload. A controller may continuously monitor a voltage drop (IR drop) across the resistance of the trace. Based on one or more limits set by a user, the controller may shut down a main power rail along with other power rails, essentially stopping execution of a sort test program.

Advantageously, the detection of extreme power dissipation within the space transformer may prevent the probe card from being damaged. This may save the expensive cost of a new probe card and the lengthy lead time to produce the new probe card and replace the old probe card with the new probe card. Also, protecting the probe card from being damaged may save repair cost and lead time of the probe card and numerous probes in the probe array. Damage of the probe card further affects production flow of semiconductor dies, impacting yield.

Figure 1B:
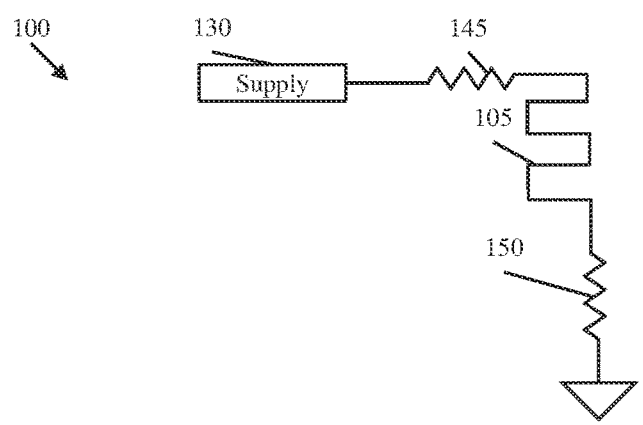

FIGS. 1A and 1B are circuit block diagrams of an apparatus 100 for protecting a probe card and probes, using a thermal heat sensor trace 105, according to aspects of the present disclosure.

Referring to FIG. 1A, the apparatus 100 includes the thermal heat sensor trace 105, a controller 110, input filter resistors 115 and 120, an input filter capacitor 125, a supply 130, a ripple filter capacitor 135, a pull-up resistor 140.

The thermal heat sensor trace 105 may include serpentine or diagonal wiring made of a conductive metal (e.g., copper) interposed between insulating material. The trace 105 is disposed in a space transformer included in the probe card. The trace 105 forms a resistance across which a voltage drop is sensed (and continuously monitored) by the controller 110, and the sensed voltage positively correlates to a temperature around the trace 105, namely, a temperature of the space transformer. A location and a function of the trace 105 will be further discussed with respect to FIG. 1C. The trace 105 may be calibrated prior to device under test (DUT) tests, using a control environment, e.g., a thermal bath. The trace 105 is serpentine or diagonal in shape because for a better signal-to-noise ratio in detection of a temperature rise in the space transformer, the trace 105 may require a certain length, a certain width, a certain thickness and/or a certain resistance, e.g., 40 ohms.

The thermal heat sensor trace 105 is connected in series to an input high terminal IN+ and an input low terminal IN− of the controller 110 through the input filter resistors 115 and 120, respectively. The input filter capacitor 125 is connected in parallel to the trace 105, and in series to the input filter resistors 115 and 120. The input filter resistors 115 and 120 and the input filter capacitor 125 thus form an input filter between the trace 105 and the input high and low terminals IN+ and IN− of the controller 110. The input filter may remove noise from a signal of the voltage to be sensed at the input high and low terminals IN+ and IN−.

The controller 110 is powered by the supply 130 connected to a VS terminal of the controller 110. The supply 130 may be a voltage supply that supplies 2.7 volts (V) to 5.5 V. The controller 110 is connected to ground via a GND terminal of the controller 110. The ripple filter capacitor 135 is connected to both the VS and GND terminals of the controller 110, and thus may filter or smooth a ripple of direct current (DC) voltages at both the VS and GND terminals. For example, a capacitance of the ripple filter capacitor 135 may be 0.1 microfarads (µF).

The controller 110 outputs the voltage sensed (and continuously monitored) across the resistance formed by the thermal heat sensor trace 105, as an output voltage signal OUT via an OUT terminal of the controller 110. The controller 110 further receives, from a user, an input analog signal LIMIT for defining a tripping overload level for the sensed voltage, via a LIM terminal of the controller 110. The input analog signal LIMIT may be calibrated based on a production use case scenario, e.g., a temperature of a wafer sort process.

For example, when the sensed voltage is greater than or equal to the tripping overload level, the controller 110 may determine that the temperature of the space transformer is too high, and may output, via an/ALR terminal of the controller 110, a low output digital signal/ALERT that may be used to reduce and/or warn of the high temperature of the space transformer. Once the low output digital signal/ALERT is output or activated, the controller 110 trips or locks the controller 110 by keeping the low output digital signal/ALERT activated while the controller 110 is powered. The controller 110 further receives, from a user, an input digital signal RESET for resetting the controller 110 when tripped, via a RES terminal of the controller 110. The controller 110, based on the input digital signal RESET, resets the controller 110 by deactivating the low output digital signal/ALERT, e.g., setting the output digital signal/ALERT to logic high in value.

The pull-up resistor 140 is connected in series to the supply 130 and the/ALR terminal of the controller 110. The pull-up resistor 140 ensures a well-defined voltage for the output digital signal/ALERT when it is logic high in value. For example, a resistance of the pull-up resistor 140 may be 10 kiloohms (W).

Referring to FIG. 1B, the apparatus 100 further includes resistors 145 and 150.

The thermal heat sensor trace 105 is additionally connected in series to the supply 130 via the resistor 145, and connected in series to ground via the resistor 150. The supply 130 and the resistors 145 and 150 thus act as a current source for the trace 105.

Figure 1C:
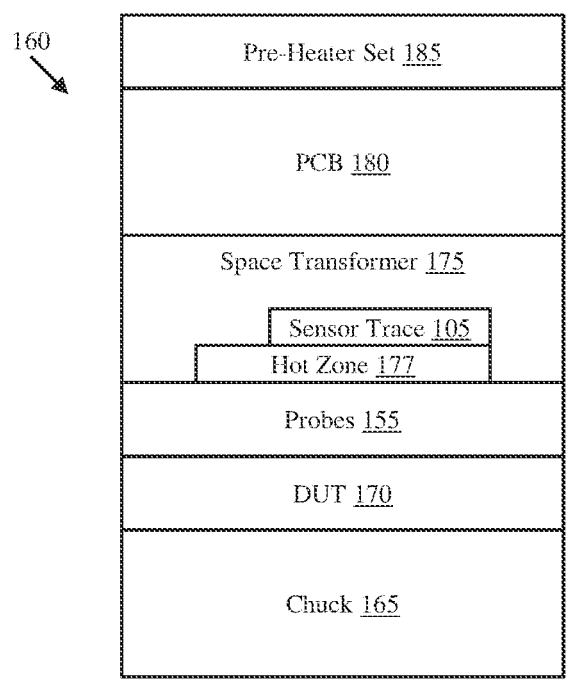
FIG. 1C is a cross-sectional view diagram of probes and a probe card in which the thermal heat sensor trace of FIGS. 1A and 1B is disposed, according to aspects of the present disclosure.

FIG. 1C is a cross-sectional view diagram of probes 155 and a probe card 160 in which the thermal heat sensor trace 105 of FIGS. 1A and 1B is disposed, according to aspects of the present disclosure.

Referring to FIG. 1C, a chuck 165 holds a DUT 170 for testing the DUT 170. The probe card 160 includes a space transformer 175, a printed circuit board (PCB) 180 disposed on the space transformer 175, and a pre-heater set 185 disposed on the PCB 180.

The space transformer 175 is connected to the DUT 170 via the probes 155, which test the DUT 170 by transmitting sort test content from the probe card 160 to the DUT 170. The space transformer 175 electrically routes the PCB 180 having a large pitch to the probes 155 having a fine pitch.

While performing the electrical routing between the PCB 180 and the probes 155, the space transformer 175 may be affected by thermal gradience from a middle layer of the DUT 170 to a middle layer of the PCB 180 and from a middle of the space transformer 175 toward its edges. This thermal gradience may cause damage (e.g., material cracks) to the space transformer 175 and/or deformation (e.g., surface warpage) of the space transformer 175. Such damage and/or deformation may cause the probes 155 to be misaligned with testing areas on the DUT 170. In particular, the space transformer 175 may include a hot zone 177 in the middle of the space transformer 175, in which the thermal gradience may be hottest in temperature.

To sense the thermal gradience in the probe card 160, especially in the hot zone 177 of the space transformer 175, the thermal heat sensor trace 105 is disposed in the space transformer 175, close to the hot zone 177. The trace 105 may be, however, embedded into or disposed on any layer of the space transformer 175.

The trace 105 forms a resistance across which a voltage drop is sensed and continuously monitored, and the sensed voltage positively correlates to a temperature around the trace 105, namely, a temperature of the space transformer 175. When the sensed voltage is greater than or equal to a predetermined threshold, it may be determined that the temperature of the space transformer 175 is too high, and corrective actions may be performed.

The pre-heater set 185 pre-heats the probe card 160, the probes 155 and the DUT 170 prior to the testing of the DUT 170.

Figure 1D:
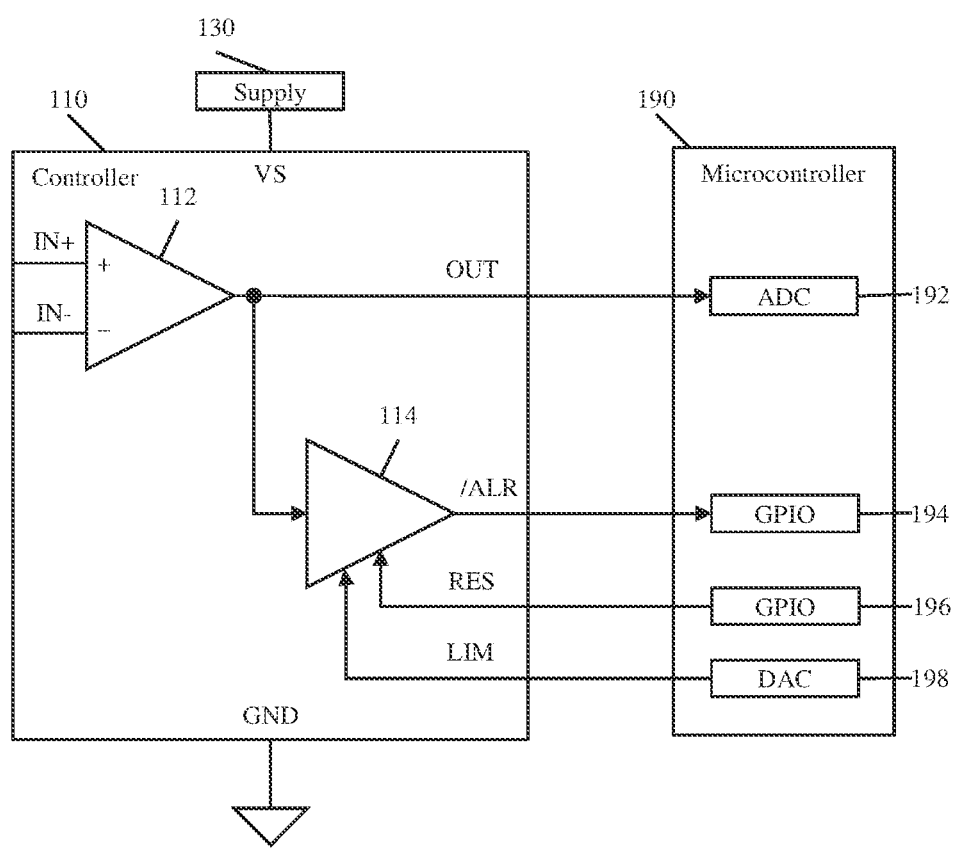
FIG. 1D is a circuit block diagram of a controller included in the apparatus of FIG. 1A and a microcontroller connected to the controller, according to aspects of the present disclosure.

FIG. 1D is a circuit block diagram of the controller 110 included in the apparatus 100 of FIG. 1A and a microcontroller 190 connected to the controller 110, according to aspects of the present disclosure.

Referring to FIG. 1D, the controller 110 includes a differential amplifier 112 and a comparator 114. The controller 110 may be disposed on the PCB (e.g., the PCB 180 of FIG. 1C) included in the probe card (e.g., the probe card 160).

The differential amplifier 112 senses a difference voltage between the input high and low terminals IN+ and IN− of the controller 110, and outputs the sensed difference voltage as the output voltage signal OUT via the OUT terminal of the controller 110. The differential amplifier 112 further outputs the sensed difference voltage to the comparator 114.

The comparator 114 compares the difference voltage with the tripping overload level defined by the input analog signal LIMIT that is received via the LIM terminal of the controller 110. For example, when the difference voltage is greater than or equal to the tripping overload level, the corresponding temperature of the space transformer (e.g., the space transformer 175) is too high, and the comparator 114 may output, via the /ALR terminal of the controller 110, the low output digital signal/ALERT that may be used to reduce or warn of the high temperature of the space transformer. Once the low output digital signal/ALERT is output or activated, the comparator 114 trips or locks the controller 110 by keeping the low output digital signal/ALERT activated while the controller 110 is powered. The comparator 114 further receives, via the RES terminal of the controller 110, the input digital signal RESET for resetting the comparator 114, e.g., for deactivating the low output digital signal/ALERT.

Referring again to FIG. 1D, the microcontroller 190 may include, e.g., an external computer or a circuit disposed on the PCB for controlling and responding to the controller 110. The microcontroller 190 includes an analog-to-digital converter (ADC) 192, a general-purpose input/output (GPIO) pin 194, a GPIO pin 196 and a digital-to-analog converter (DAC) 198.

The ADC 192 receives the sensed difference voltage from the differential amplifier 112 via the OUT terminal of the controller 110. The ADC 192 further converts the received difference voltage (an analog signal) to a digital signal for use in the microcontroller 190. For example, the microcontroller 190 may record the digital signal.

The GPIO pin 194 receives the output digital signal/ALERT from the comparator 114 via the /ALR terminal of the controller 110, for use in the microcontroller 190. For example, the microcontroller 190 may, based on the output digital signal/ALERT, control a display to display, to a user, an alert indicating that the temperature of the space transformer is too high or that the space transformer is overheating. Further, the microcontroller 190 may transmit the output digital signal/ALERT to a force trip circuit for a DPS of the probe card, so that the force trip circuit, based on the output digital signal/ALERT, shuts down the DPS to reduce the temperature of the space transformer, as will be described with respect to FIG. 2.

The GPIO pin 196 transmits the input digital signal RESET to the comparator 114 via the RES terminal of the controller 110.

The DAC 198 converts a digital signal to the input analog signal LIMIT. The DAC 198 further transmits the input analog signal LIMIT to the comparator 114 via the LIM terminal of the controller 110.

Figure 2:
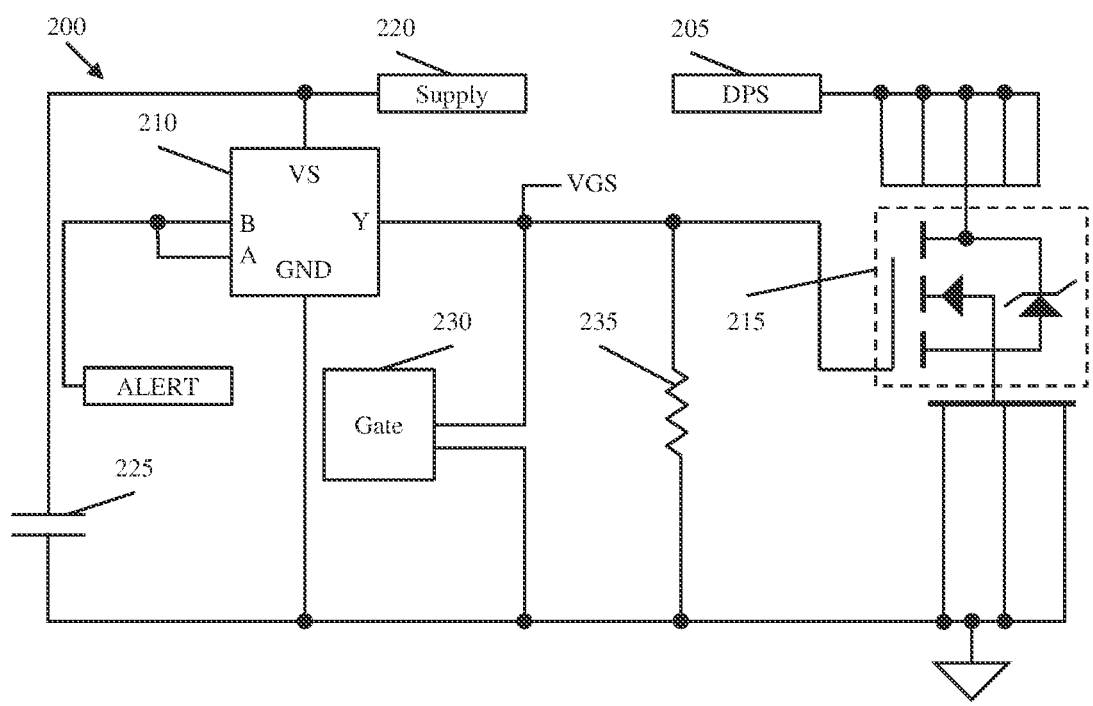
FIG. 2 is a circuit block diagram of a force trip circuit for a device power supply (DPS) of a probe card, according to aspects of the present disclosure.

FIG. 2 is a circuit block diagram of a force trip circuit 200 for a DPS 205 of a probe card, according to aspects of the present disclosure.

Referring to FIG. 2, the force trip circuit 200 includes a NAND gate integrated circuit (IC) 210, a high-power n-channel trench field effect transistor (TFET) 215, a supply 220, a ripple filter capacitor 225, a NAND gate 230 and a pull-down resistor 235.

The NAND gate IC 210 receives the low output digital signal/ALERT from the controller 110 of FIGS. 1A and 1D, and inverts the received low output digital signal/ALERT to be logic high in value, to turn on the high-power n-channel TFET 215, which then shorts the DPS 205 (e.g., a main power rail of the probe card) to ground. Thus, the DPS 205 no longer powers the probe card, namely, a space transformer included in the probe card, to prevent overheating in the space transformer. When the output digital signal/ALERT received from the controller 110 returns to be logic high in value (e.g., when there is no overheating in the space transformer), the NAND gate IC 210 inverts the received high output digital signal/ALERT to be logic low in value, to turn off or open the high-power n-channel TFET 215, which then disconnects the DPS 205 from ground.

The NAND gate IC 210 is powered by the supply 220 connected to a VS terminal of the NAND gate IC 210. The supply 220 may be a voltage supply that supplies 2.7 V to 5.5 V. The NAND gate IC 210 is connected to ground via a GND terminal of the NAND gate IC 210. The ripple filter capacitor 225 is connected to both the VS and GND terminals of NAND gate IC 210, and thus may filter or smooth a ripple of DC voltages at both the VS and GND terminals. For example, a capacitance of the ripple filter capacitor 225 may be 0.1 μF.

The NAND gate 230 may invert an output of the NAND gate IC 210, and transmit the inverted output to other power circuits (e.g., another force trip circuit) as the output digital signal/ALERT, when there are multiple thermal heat sensor traces disposed in the space transformer and monitoring a temperature of the space transformer. This way, the other power circuits may shut down to protect the space transformer when the overheating at the space transformer is detected by one of the multiple thermal heat sensor traces.

The pull-down resistor 235 is connected in series to the output of the NAND gate IC 210 and ground. The pull-down resistor 235 ensures a well-defined voltage for the output of the NAND gate IC 210 when it is logic low in value. For example, a resistance of the pull-down resistor 235 may be 100 kΩ.

Advantageously, the force trip circuit 200 may instantly shut down the DPS 205 in, e.g., 10-40 microseconds. The force trip circuit 200 may further drain a bulk capacitance charge to avoid discharging this charge through probes during testing.

Figure 3:
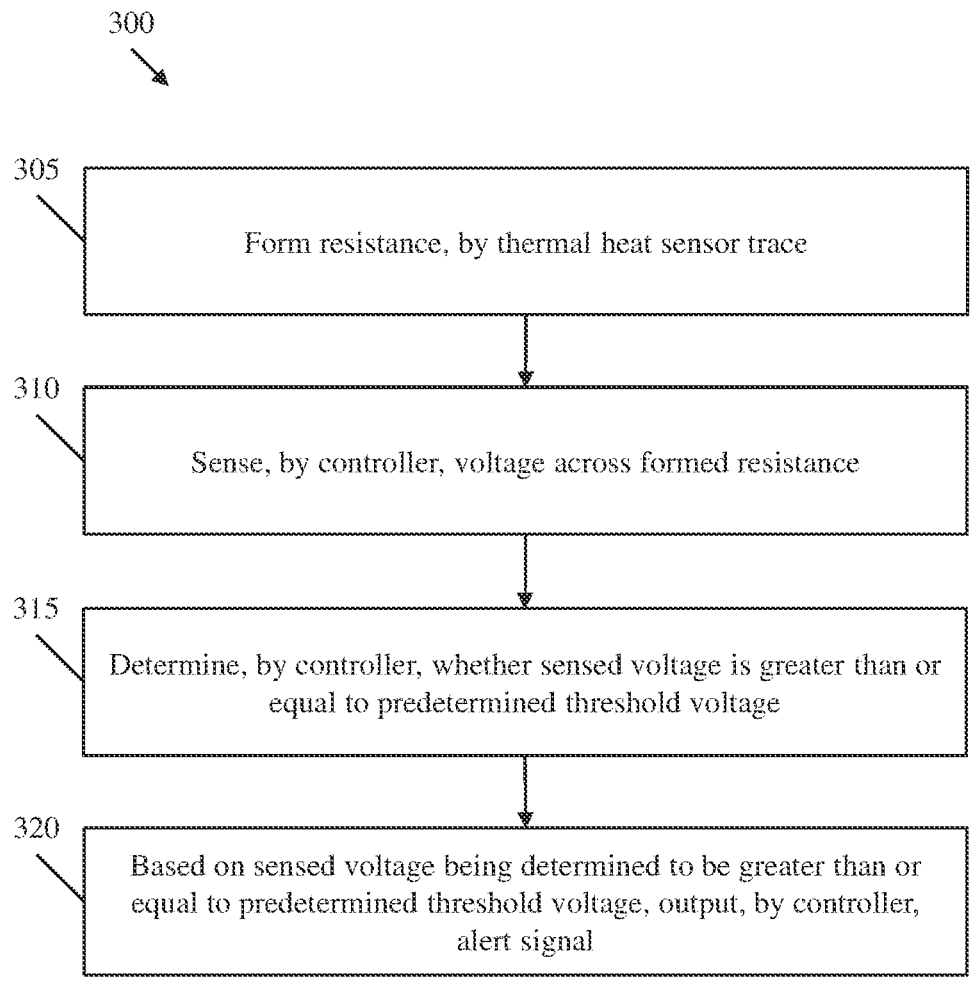
FIG. 3 is a flow diagram of a method of protecting a probe card and probes, using a thermal heat sensor trace, according to aspects of the present disclosure.

FIG. 3 is a flow diagram of a method 300 of protecting a probe card and probes, using a thermal heat sensor trace, according to aspects of the present disclosure.

Referring to FIG. 3, in operation 305, the method 300 includes forming a resistance, by a thermal heat sensor trace including conductive metal and disposed in a space transformer.

In operation 310, the method 300 includes sensing, by a controller, a voltage across the resistance formed by the thermal heat sensor trace, the voltage positively correlating to a temperature of the space transformer.

In operation 315, the method 300 includes determining, by the controller, whether the sensed voltage is greater than or equal to a predetermined threshold voltage.

In operation 320, the method 300 includes, based on the sensed voltage being determined to be greater than or equal to the predetermined threshold voltage, outputting, by the controller, an alert signal for reducing and/or warning of the temperature of the space transformer.

The method 300 may further include removing, by an input filter, noise from a voltage signal of the voltage.

The method 300 may further include receiving, by the controller, a reset signal for resetting the controller, and based the reset signal being received, resetting, by the controller, the controller by deactivating the output alert signal.

The alert signal may be output to a microcontroller configured to, based on the output alert signal, control a display to display an alert indicating that the space transformer is overheating.

The alert signal may be output to a force trip circuit for a DPS of a probe card, the force trip circuit being configured to, based on the output alert signal, shut down the DPS to reduce the temperature of the space transformer included in the probe card.

The methods and sequence of steps presented above are intended to be examples for protecting a probe card and probes, using a thermal heat sensor trace, according to aspects of the present disclosure. It will be apparent to those ordinary skilled practitioners that the foregoing process operations may be modified without departing from the spirit of the present disclosure.

To more readily understand and put into practical effect the present apparatuses and methods, particular aspects will now be described by way of examples. For the sake of brevity, duplicate descriptions of features and properties may be omitted.

EXAMPLES

Example 1 provides an apparatus including a thermal heat sensor trace including conductive metal and disposed in a space transformer, the thermal heat sensor trace being configured to form a resistance, and a controller configured to sense a voltage across the resistance formed by the thermal heat sensor trace, the voltage positively correlating to a temperature of the space transformer. The controller is further configured to determine whether the sensed voltage is greater than or equal to a predetermined threshold voltage, and based on the sensed voltage being determined to be greater than or equal to the predetermined threshold voltage, output an alert signal for reducing and/or warning of the temperature of the space transformer.

Example 2 may include the apparatus of example 1 and/or any other example disclosed herein, for which the thermal heat sensor trace includes serpentine or diagonal wiring.

Example 3 may include the apparatus of example 1 and/or any other example disclosed herein, further including a first input filter resistor connected in series to the thermal heat sensor trace and an input high terminal of the controller, a second input filter resistor connected in series to the thermal heat sensor trace and an input low terminal of the controller, and an input filter capacitor connected in parallel to the thermal heat sensor trace and in series to the first input filter resistor and the second input filter resistor. The first input filter resistor, the second input filter resistor and the input filter capacitor may form an input filter configured to remove noise from a voltage signal of the voltage.

Example 4 may include the apparatus of example 1 and/or any other example disclosed herein, for which the controller may be further configured to receive a reset signal for resetting the controller, and based the reset signal being received, reset the controller by deactivating the output alert signal.

Example 5 may include the apparatus of example 1 and/or any other example disclosed herein, further including a voltage supply, a first resistor connected in series to the voltage supply and the thermal heat sensor trace, and a second resistor connected in series to the thermal heat sensor trace and ground. The voltage supply, the first resistor and the second resistor may form a current source for the thermal heat sensor trace.

Example 6 may include the apparatus of example 1 and/or any other example disclosed herein, for which the space transformer may be connected to a device under test (DUT) via probes, and may be configured to electrically route a printed circuit board (PCB) having a large pitch to the probes having a fine pitch.

Example 7 may include the apparatus of example 6 and/or any other example disclosed herein, for which the thermal heat sensor trace may be disposed adjacent to a hot zone included in the space transformer, in which a thermal gradience is hottest in temperature, and the thermal gradience may be from a middle layer of the DUT to a middle layer of the PCB and from a middle of the space transformer toward edges of the space transformer.

Example 8 may include the apparatus of example 1 and/or any other example disclosed herein, for which the controller may include a differential amplifier configured to sense the voltage across the resistance formed by the thermal heat sensor trace, and a comparator configured to determine whether the sensed voltage is greater than or equal to the predetermined threshold voltage, and based on the sensed voltage being determined to be greater than or equal to the predetermined threshold voltage, output the alert signal.

Example 9 may include the apparatus of example 1 and/or any other example disclosed herein, for which the alert signal may be output to a microcontroller configured to, based on the output alert signal, control a display to display an alert indicating that the space transformer is overheating.

Example 10 may include the apparatus of example 1 and/or any other example disclosed herein, for which the alert signal may be output to a force trip circuit for a device power supply (DPS) of a probe card, the force trip circuit being configured to, based on the output alert signal, shut down the DPS to reduce the temperature of the space transformer included in the probe card.

Example 11 provides a method including forming a resistance, by a thermal heat sensor trace including conductive metal and disposed in a space transformer, and sensing, by a controller, a voltage across the resistance formed by the thermal heat sensor trace, the voltage positively correlating to a temperature of the space transformer. The method further includes determining, by the controller, whether the sensed voltage is greater than or equal to a predetermined threshold voltage, and based on the sensed voltage being determined to be greater than or equal to the predetermined threshold voltage, outputting, by the controller, an alert signal for reducing and/or warning of the temperature of the space transformer.

Example 12 may include the method of example 11 and/or any other example disclosed herein, further including removing, by an input filter, noise from a voltage signal of the voltage.

Example 13 may include the method of example 11 and/or any other example disclosed herein, further including receiving, by the controller, a reset signal for resetting the controller, and based the reset signal being received, resetting, by the controller, the controller by deactivating the output alert signal.

Example 14 may include the method of example 11 and/or any other example disclosed herein, for which the alert signal may be output to a microcontroller configured to, based on the output alert signal, control a display to display an alert indicating that the space transformer is overheating.

Example 15 may include the method of example 11 and/or any other example disclosed herein, for which the alert signal may be output to a force trip circuit for a device power supply (DPS) of a probe card, the force trip circuit being configured to, based on the output alert signal, shut down the DPS to reduce the temperature of the space transformer included in the probe card.

Example 16 provides an apparatus including forming means for forming a resistance, the forming means including conductive metal and disposed in a space transformer, and sensing means for sensing a voltage across the resistance formed by the forming means, the voltage positively correlating to a temperature of the space transformer. The apparatus includes determining means for determining whether the sensed voltage is greater than or equal to a predetermined threshold voltage, and outputting means for, based on the sensed voltage being determined to be greater than or equal to the predetermined threshold voltage, outputting an alert signal for reducing and/or warning of the temperature of the space transformer.

Example 17 may include the apparatus of example 16 and/or any other example disclosed herein, further including removing means for removing noise from a voltage signal of the voltage.

Example 18 may include the apparatus of example 16 and/or any other example disclosed herein, further including receiving means for receiving a reset signal for resetting the outputting means, and resetting means for, based the reset signal being received, resetting the outputting means by deactivating the output alert signal.

Example 19 may include the apparatus of example 16 and/or any other example disclosed herein, for which the alert signal may be output to a microcontroller configured to, based on the output alert signal, control a display to display an alert indicating that the space transformer is overheating.

Example 20 may include the apparatus of example 16 and/or any other example disclosed herein, for which the alert signal may be output to a force trip circuit for a device power supply (DPS) of a probe card, the force trip circuit being configured to, based on the output alert signal, shut down the DPS to reduce the temperature of the space transformer included in the probe card.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The methods described herein may be performed and the various processing or computation units and the devices and computing entities described herein may be implemented by one or more circuits. In an embodiment, a "circuit" may be understood as any kind of a logic implementing entity, which may be hardware, software, firmware, or any combination thereof. Thus, in an embodiment, a "circuit" may be a hard-wired logic circuit or a programmable logic circuit such as a programmable processor, e.g., a microprocessor. A "circuit" may also be software being implemented or executed by a processor, e.g., any kind of computer program, e.g., a computer program using a virtual machine code. Any other kind of implementation of the respective functions that are described herein may also be understood as a "circuit" in accordance with an alternative embodiment.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. An apparatus comprising:
   a thermal heat sensor trace comprising conductive metal and disposed in a space transformer, the thermal heat sensor trace being configured to form a resistance; and
   a controller configured to:
      sense a voltage across the resistance formed by the thermal heat sensor trace, the voltage positively correlating to a temperature of the space transformer;
      determine whether the sensed voltage is greater than or equal to a predetermined threshold voltage; and
      based on the sensed voltage being determined to be greater than or equal to the predetermined threshold voltage, output an alert signal for reducing and/or warning of the temperature of the space transformer.

2. The apparatus of claim 1, wherein the thermal heat sensor trace comprises serpentine or diagonal wiring.

3. The apparatus of claim 1, further comprising:
   a first input filter resistor connected in series to the thermal heat sensor trace and an input high terminal of the controller;
   a second input filter resistor connected in series to the thermal heat sensor trace and an input low terminal of the controller; and
   an input filter capacitor connected in parallel to the thermal heat sensor trace and in series to the first input filter resistor and the second input filter resistor,
   wherein the first input filter resistor, the second input filter resistor and the input filter capacitor form an input filter configured to remove noise from a voltage signal of the voltage.

4. The apparatus of claim 1, wherein the controller is further configured to:
   receive a reset signal for resetting the controller; and
   based the reset signal being received, reset the controller by deactivating the output alert signal.

5. The apparatus of claim 1, further comprising:
   a voltage supply;
   a first resistor connected in series to the voltage supply and the thermal heat sensor trace; and
   a second resistor connected in series to the thermal heat sensor trace and ground, wherein the voltage supply, the first resistor and the second resistor form a current source for the thermal heat sensor trace.

6. The apparatus of claim 1, wherein the space transformer is connected to a device under test (DUT) via probes, and is configured to electrically route a printed circuit board (PCB) having a large pitch to the probes having a fine pitch.

7. The apparatus of claim 6, wherein the thermal heat sensor trace is disposed adjacent to a hot zone comprised in the space transformer, in which a thermal gradience is hottest in temperature, and the thermal gradience is from a middle layer of the DUT to a middle layer of the PCB and from a middle of the space transformer toward edges of the space transformer.

8. The apparatus of claim 1, wherein the controller comprises:

a differential amplifier configured to sense the voltage across the resistance formed by the thermal heat sensor trace; and a comparator configured to:
determine whether the sensed voltage is greater than or equal to the predetermined threshold voltage; and
based on the sensed voltage being determined to be greater than or equal to the predetermined threshold voltage, output the alert signal.

9. The apparatus of claim 1, wherein the alert signal is output to a microcontroller configured to, based on the output alert signal, control a display to display an alert indicating that the space transformer is overheating.

10. The apparatus of claim 1, wherein the alert signal is output to a force trip circuit for a device power supply (DPS) of a probe card, the force trip circuit being configured to, based on the output alert signal, shut down the DPS to reduce the temperature of the space transformer comprised in the probe card.

11. A method comprising:

forming a resistance, by a thermal heat sensor trace comprising conductive metal and disposed in a space transformer;

sensing, by a controller, a voltage across the resistance formed by the thermal heat sensor trace, the voltage positively correlating to a temperature of the space transformer;

determining, by the controller, whether the sensed voltage is greater than or equal to a predetermined threshold voltage; and based on the sensed voltage being determined to be greater than or equal to the predetermined threshold voltage, outputting, by the controller, an alert signal for reducing and/or warning of the temperature of the space transformer.

12. The method of claim 11, further comprising removing, by an input filter, noise from a voltage signal of the voltage.

13. The method of claim 11, further comprising:
receiving, by the controller, a reset signal for resetting the controller; and
based the reset signal being received, resetting, by the controller, the controller by deactivating the output alert signal.

14. The method of claim 11, wherein the alert signal is output to a microcontroller configured to, based on the output alert signal, control a display to display an alert indicating that the space transformer is overheating.

15. The method of claim 11, wherein the alert signal is output to a force trip circuit for a device power supply (DPS) of a probe card, the force trip circuit being configured to, based on the output alert signal, shut down the DPS to reduce the temperature of the space transformer comprised in the probe card.

16. An apparatus comprising:

forming means for forming a resistance, the forming means comprising conductive metal and disposed in a space transformer;

sensing means for sensing a voltage across the resistance formed by the forming means, the voltage positively correlating to a temperature of the space transformer;

determining means for determining whether the sensed voltage is greater than or equal to a predetermined threshold voltage; and outputting means for, based on the sensed voltage being determined to be greater than or equal to the predetermined threshold voltage, outputting an alert signal for reducing and/or warning of the temperature of the space transformer.

17. The apparatus of claim 16, further comprising removing means for removing noise from a voltage signal of the voltage.

18. The apparatus of claim 16, further comprising:
receiving means for receiving a reset signal for resetting the outputting means; and
resetting means for, based the reset signal being received, resetting the outputting means by deactivating the output alert signal.

19. The apparatus of claim 16, wherein the alert signal is output to a microcontroller configured to, based on the output alert signal, control a display to display an alert indicating that the space transformer is overheating.

20. The apparatus of claim 16, wherein the alert signal is output to a force trip circuit for a device power supply (DPS) of a probe card, the force trip circuit being configured to, based on the output alert signal, shut down the DPS to reduce the temperature of the space transformer comprised in the probe card.

* * * * *